(12) United States Patent
Chinnaveerappan et al.

(10) Patent No.: US 7,830,412 B2
(45) Date of Patent: Nov. 9, 2010

(54) METHOD AND APPARATUS FOR SHIELDING CORRECTION PIXELS FROM SPURIOUS CHARGES IN AN IMAGER

(75) Inventors: Kalairaja Chinnaveerappan, Boise, ID (US); Sungkuk Hong, Boise, ID (US); Ji Soo Lee, Santa Clara, CA (US); Sungkwon C. Hong, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 1331 days.

(21) Appl. No.: 11/207,811

(22) Filed: Aug. 22, 2005

(65) Prior Publication Data

US 2007/0041062 A1    Feb. 22, 2007

(51) Int. Cl.
  *H04N 5/225* (2006.01)
  *H01L 23/552* (2006.01)
(52) U.S. Cl. .................................. 348/207.99; 257/660
(58) Field of Classification Search ................. 257/435, 257/431, 653, 223, 660
  See application file for complete search history.

(56) References Cited

U.S. PATENT DOCUMENTS

| | | | | |
|---|---|---|---|---|
| 5,619,049 A | * | 4/1997 | Kim ............................. | 257/223 |
| 6,127,230 A | * | 10/2000 | Tang et al. ................... | 438/268 |
| 6,344,672 B2 | * | 2/2002 | Huffman ..................... | 257/296 |
| 6,433,374 B1 | * | 8/2002 | Fukunaga et al. ............ | 257/292 |
| 6,465,859 B1 | * | 10/2002 | Fujiwara et al. .............. | 257/435 |
| 6,721,005 B1 | | 4/2004 | Higuchi | |
| 6,885,047 B2 | * | 4/2005 | Shinohara et al. ........... | 257/292 |
| 7,005,690 B2 | * | 2/2006 | Chijiiwa et al. ............. | 257/292 |
| 7,110,028 B1 | * | 9/2006 | Merrill ....................... | 348/294 |
| 2001/0015475 A1 | * | 8/2001 | Sharples ..................... | 257/577 |
| 2002/0096733 A1 | * | 7/2002 | Rhodes ....................... | 257/462 |
| 2002/0158294 A1 | | 10/2002 | Fujiwara et al. | |
| 2003/0052349 A1 | * | 3/2003 | Lee et al. .................... | 257/291 |
| 2003/0201518 A1 | | 10/2003 | Mann et al. | |
| 2005/0133825 A1 | * | 6/2005 | Rhodes et al. .............. | 257/204 |
| 2005/0167774 A1 | | 8/2005 | Rhodes et al. | |

FOREIGN PATENT DOCUMENTS

| | | |
|---|---|---|
| EP | 0 469 878 A1 | 2/1992 |
| EP | 0469878 | 2/1992 |
| JP | 05 129572 | 5/1993 |
| JP | 05129572 | 5/1993 |

(Continued)

OTHER PUBLICATIONS

International Search Report dated Nov. 22, 2006.

(Continued)

*Primary Examiner*—Lin Ye
*Assistant Examiner*—Euel K Cowan

(57) ABSTRACT

A barrier for isolating the dark correction pixels from spurious charges within an image sensor. The barrier comprises a charge absorbing region in a substrate electrically connected to a voltage source terminal. The charge absorbing region completely surrounds the dark correction region of a pixel array. The charge absorbing region absorbs carriers generated by lateral diffusion, near-infrared and infrared light reflected from the bottom of the silicon substrate, and other sources. This absorbing region prevents carriers from being absorbed into the dark correction pixel cells and causing image correction distorting effects.

36 Claims, 11 Drawing Sheets

FOREIGN PATENT DOCUMENTS

| | | |
|---|---|---|
| TW | 200303688 | 9/2003 |
| TW | 591956 | 6/2004 |

OTHER PUBLICATIONS

U.S. Appl. No. 10/893,293, filed Jul. 19, 2004, Li, J (Jintao); Li, J. (Jin).

U.S. Appl. No. 10/879,170, filed Jun. 30, 2004, Ovsiannikov, I.

Austrian Search Report and Written Opinion dated Feb. 20, 2009.

Taiwan Search Report, Jul. 22, 2009.

\* cited by examiner

METHOD AND APPARATUS FOR SHIELDING CORRECTION PIXELS FROM SPURIOUS CHARGES IN AN IMAGER

FIELD OF THE INVENTION

The present invention relates to the field of semiconductor devices, and particularly to improved charge isolation techniques for image sensors.

BACKGROUND OF THE INVENTION

An image sensor generally includes an array of pixel cells. Each pixel cell includes a photo-conversion device for converting light incident on the array into electrical signals. An image sensor also typically includes peripheral circuitry for controlling devices of the array and for converting the electrical signals into a digital image.

FIG. 1 is a top plan view block diagram of a portion of a typical CMOS image sensor 10. The image sensor 10 includes an array 11 of pixel cells arranged in columns and rows (not shown). The array 11 includes pixel cells 20 (FIG. 2A) in an active array region 12 and pixel cells 20' (FIG. 3) in a dark correction region 13 that are used for noise or dark correction. FIG. 2A is a schematic diagram of typical pixel cells 20 and FIG. 2B is a top plan view of a pixel cell 20. The dark correction pixel cells 20' have the same structure and operate in a similar manner to the active array pixel cells 20. Accordingly, dark correction pixel cells 20' can be configured as shown in FIG. 2A.

The dark correction region 13 is similar to the active array region 12, except that light is prevented from reaching the photo-conversion devices of the dark correction pixel cells 20' by, for example, a metal layer, a black color filter array, or any opaque material, depicted as 14 in FIG. 3. Signals from dark correction pixel cells 20' can be used to determine the dark correction level for the array 11, which is used to adjust the resulting image produced by the image sensor 10, by subtracting the signal generated by the dark correction pixel cells 20' from the signal from the pixel cells 20, which are used for image capture.

The pixel cells 20 illustrated in FIGS. 2A and 2B are typical CMOS four-transistor (4T) pixel cells. Typically, the pixel cells 20 are formed at a surface of a substrate, as generally shown in FIG. 3. As is known in the art, a pixel cell 20 functions by receiving photons of light and converting those photons into electron charges. For this operation, each one of the pixel cells 20 includes a photo-conversion device 21, which may be a pinned photodiode, but can be a photogate, photoconductor, or other photosensitive device. The photodiode photo-conversion device 21 typically includes an n-type photodiode charge accumulation region 22 and a p-type surface layer.

Each pixel cell 20 also includes a transfer transistor 27, which receives a transfer control signal TX at its gate 27a. The transfer transistor 27 is connected between the photodiode photo-conversion device 21 and a floating diffusion region 25. During operation, the TX signal activates the transfer transistor 27 to transfer charge from the charge accumulation region 22 to the floating diffusion region 25.

The pixel cell 20 further includes a reset transistor 28, which receives a reset control signal RST at its gate 28a. The reset transistor 28 is connected to the floating diffusion region 25 and includes a source/drain region 60 coupled to a voltage supply, $V_{aa\,pix}$, through a contact 23. In response to the RST signal the reset transistor 28 is activated and resets the diffusion region 25 to a predetermined charge level through a supply voltage, e.g., $V_{aa\,pix}$.

A source follower transistor 29, having a gate 29a coupled to the floating diffusion region 25 through a contact 23, receives and amplifies a charge level from the diffusion region 25. The source follower transistor 29 also includes a first source/drain region 60 coupled to the power supply voltage $V_{aa\,pix}$, and a second source/drain region 60 connected to a row select transistor 26. The row select transistor 26 receives a row select control signal ROW_SEL at its gate 26a. In response to the ROW_SEL signal, the row select transistor 26 couples the pixel cell 20 to a column line 22, which is coupled to a source/drain region 60 of the row select transistor 26. When the row select gate 26a is activated, an output voltage is output from the pixel cell 20 through the column line 22.

Referring again to FIG. 1, after pixel cells of array 11 generate charge in response to incident light, electrical signals indicating charge levels are read out and processed by circuitry 15 peripheral to array 11. Peripheral circuitry 15 typically includes row select circuitry 16 and column select circuitry 17 for activating particular rows and columns of the array 11; and other peripheral circuitry 18, which can include analog signal processing circuitry, analog-to-digital conversion circuitry, and digital logic processing circuitry. Peripheral circuitry 15 can be located adjacent to the array 11, as shown in FIG. 1.

In order to obtain a high quality image, it is important to obtain an accurate dark correction level for the array 11. One problem encountered in the conventional image sensor 10 is interference to the signal produced by dark current pixel cells 20' caused by photons entering the area 12 of the array containing active array pixel cells 20, as shown in FIG. 3, which is a cross-section taken across line X-X of FIG. 1. Dark correction region 13 is shielded from incident light by a shield 14. Longer wavelength light, such as near-infrared or infrared light at 800-1500 μm, may be reflected off the bottom 9 of the substrate 5 and generate carriers B that may also be absorbed by dark correction pixel cells 20'. In addition, when very bright light is incident on active array pixel cells 20 adjacent the dark correction region 13, blooming can occur and excess charge from the active array pixel cells 20, represented by carriers A, can travel to and be absorbed by dark correction pixel cells 20' in the adjacent dark correction region 13. In addition, excess charge from adjacent circuitry, e.g., peripheral circuitry 15, can travel to and interfere with pixel cells 20' in the adjacent dark correction region 13.

These sources, and others, cause inaccurate dark correction levels. When enough carriers are absorbed by the dark correction pixel cells 20', the signal generated by the dark correction pixel cells 20' will be artificially high, such that the row in active array region 12 corresponding to each of these pixels 20' will be over-corrected. The row in active array region 12 corresponding to each of the pixels 20' will have a signal subtracted by a greater amount than actually needed for noise or dark correction. This causes inaccurate dark correction levels, resulting in row banding and distortion of the resultant image. Dark rows may appear in the image, even though they should appear bright in response to a bright subject.

Accordingly, it would be advantageous to have an improved image sensor with reduced interference on dark correction pixel cells.

BRIEF SUMMARY OF THE INVENTION

Exemplary embodiments of the invention provide a barrier for isolating the dark correction pixels of an image sensor. The barrier comprises a charge absorbing region in a substrate electrically connected to a voltage source terminal. The charge absorbing region is completely surrounds the dark correction region of a pixel array. The charge absorbing region absorbs carriers generated by lateral diffusion, near-infrared and infrared light reflected from the bottom of the silicon substrate, and charges from other sources that may diffuse into dark correction pixels. This absorbing region prevents carriers from being absorbed into the dark correction pixel cells and causing row banding and other image distorting effects.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

Figure 1:
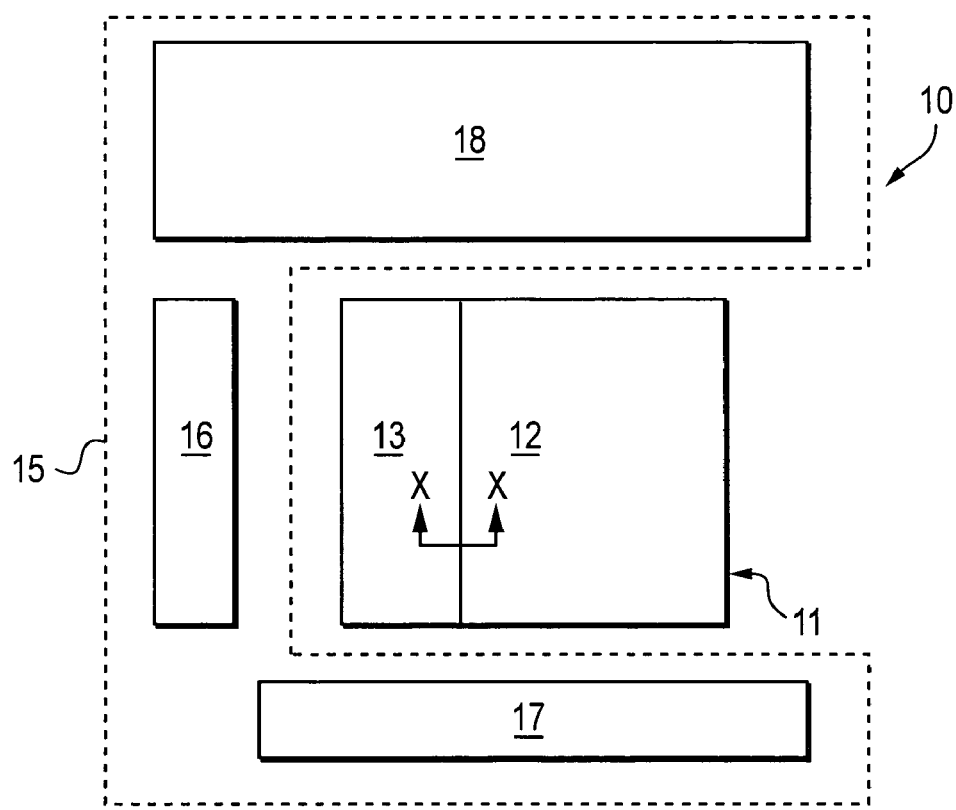
FIG. 1 is a top plan view block diagram of a conventional image sensor.
Figure 2A:
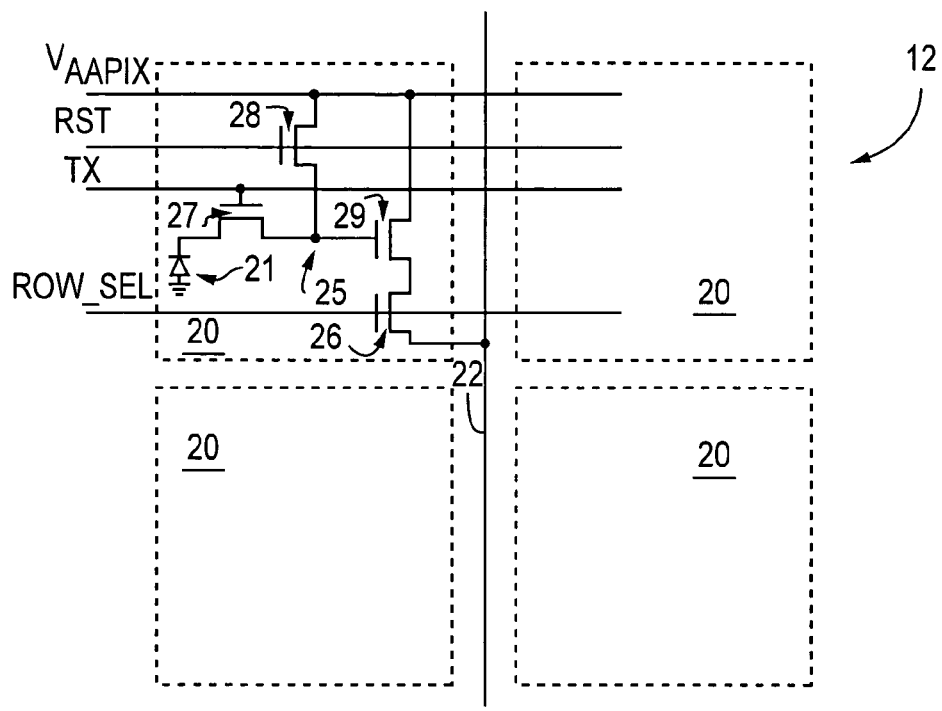
FIG. 2A is a schematic diagram of conventional CMOS pixel cells.
Figure 2B:
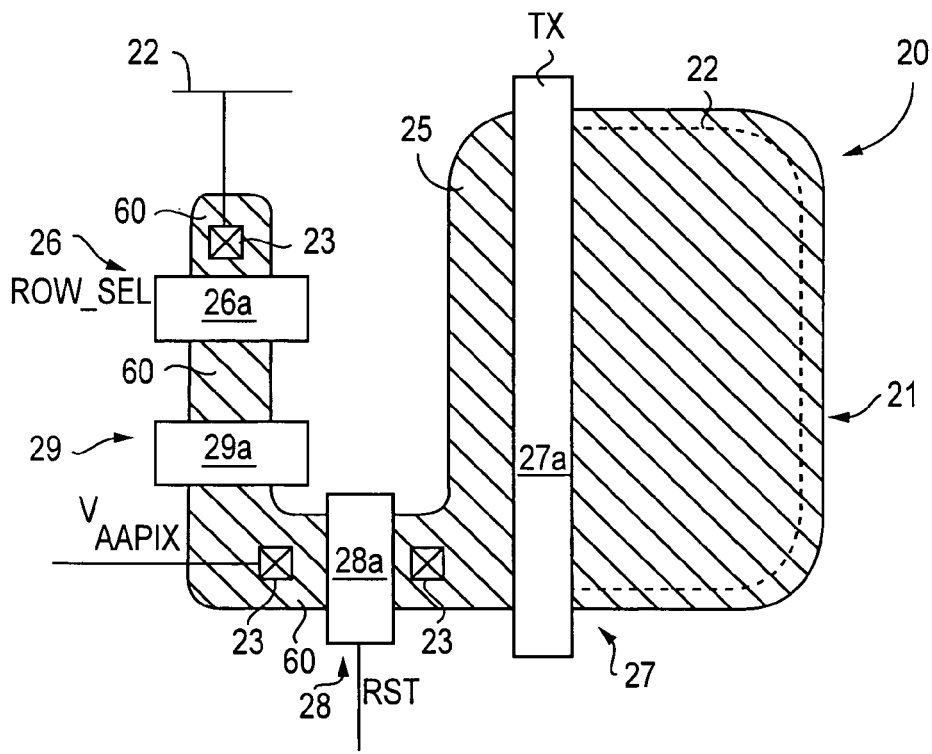
FIG. 2B is a top plan view of a pixel cell of FIG. 2A.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" or "pixel cell" refers to a picture element unit cell containing a photo-conversion device for converting electromagnetic radiation to an electrical signal.

Figure 4:
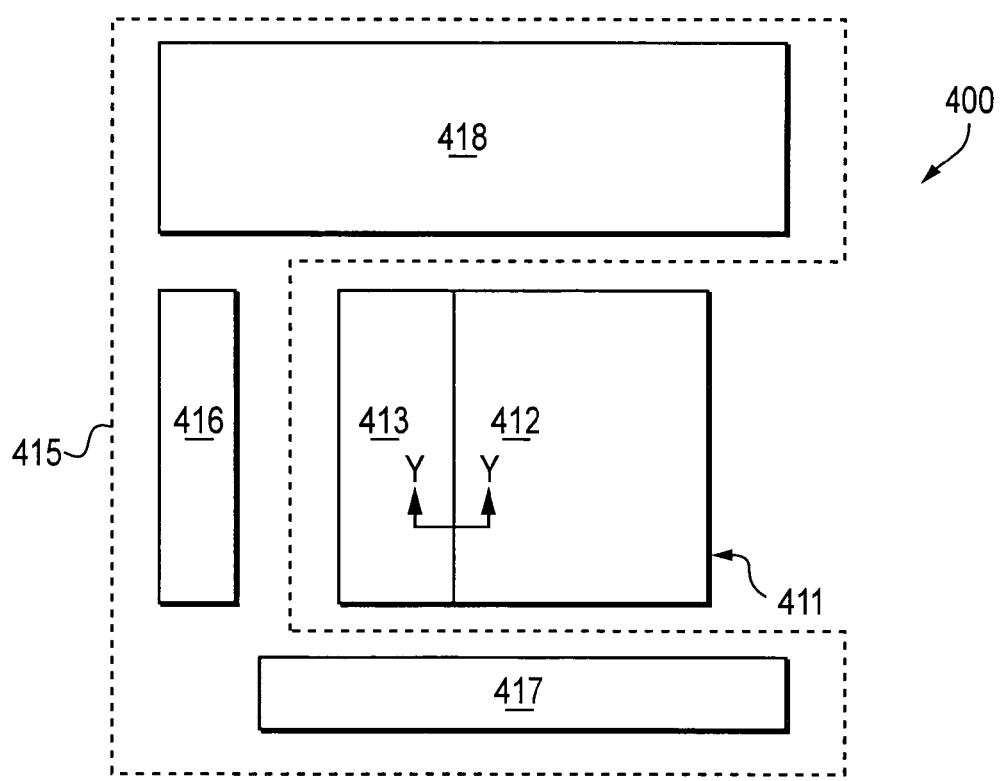
FIG. 4 is a top plan view block diagram of an image sensor according to an exemplary embodiment of the invention.

Referring to the drawings, FIG. 4 depicts a top plan view of an image sensor 400 constructed according to an exemplary embodiment of the invention. The image sensor 400 includes an array 411 of pixel cells arranged in columns and rows. The array 411 includes pixel cells 420 (FIG. 5) in an active array region 412 and pixel cells 420' in a dark correction region 413 that are used for row-wise noise or dark correction while having additional protection against noise.

After pixel cells of array 411 generate charge in response to incident light, electrical signals indicating charge levels are read out and processed by circuitry 415 peripheral to array 411. Peripheral circuitry 415 typically includes row select circuitry 416 and column select circuitry 417 for activating particular rows and columns of the array 411; and other peripheral circuitry 418, which can include analog signal processing circuitry, analog-to-digital conversion circuitry, and digital logic processing circuitry. Peripheral circuitry 415 can be located adjacent to the array 411. The configuration of image sensor 400 is exemplary only. Accordingly, image sensor 400 need not include peripheral circuitry 415 adjacent to the array 411.

Figure 3:
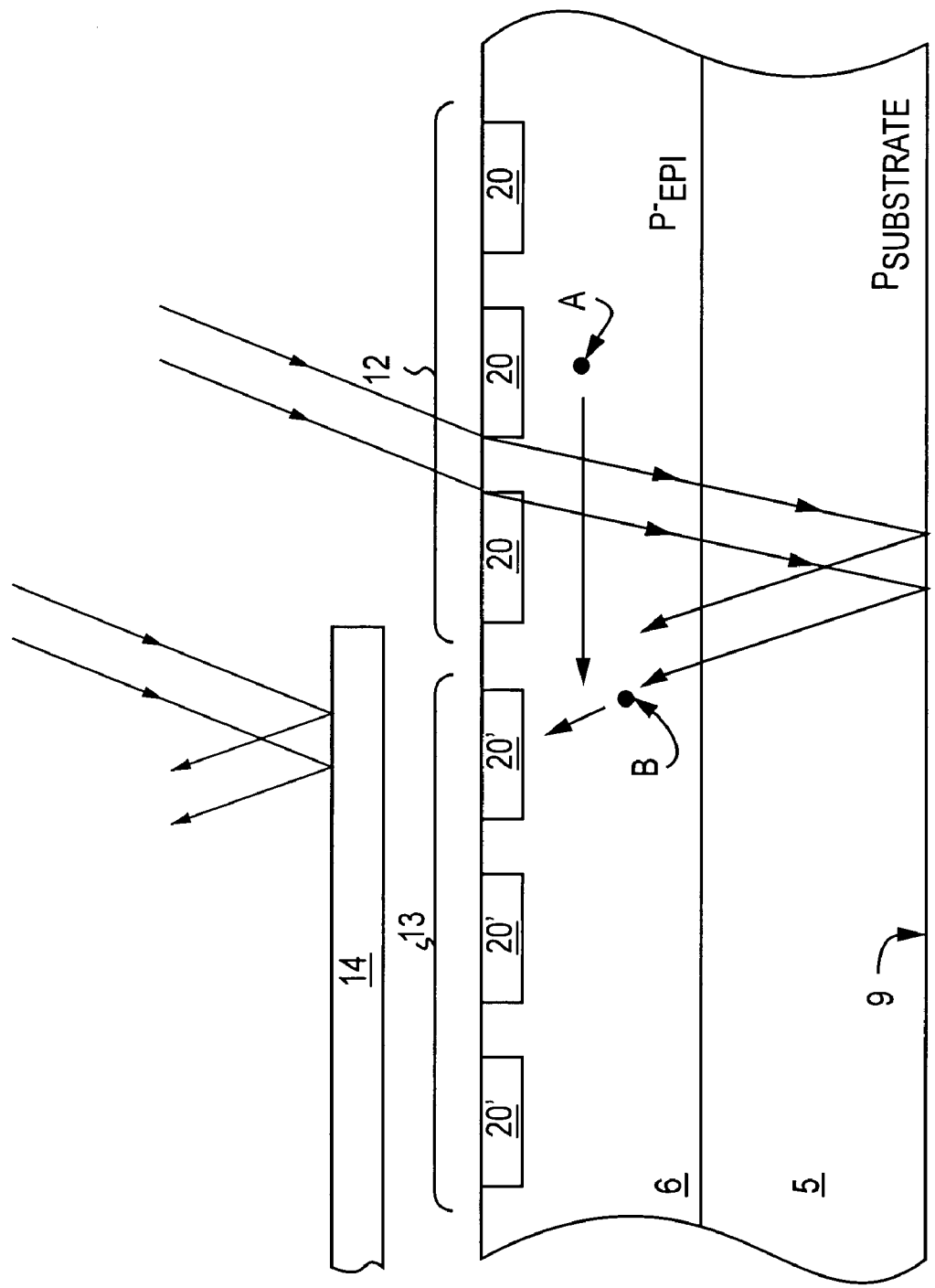
FIG. 3 is a cross-section of the image sensor of FIG. 1, taken across line X-X.
Figure 5:
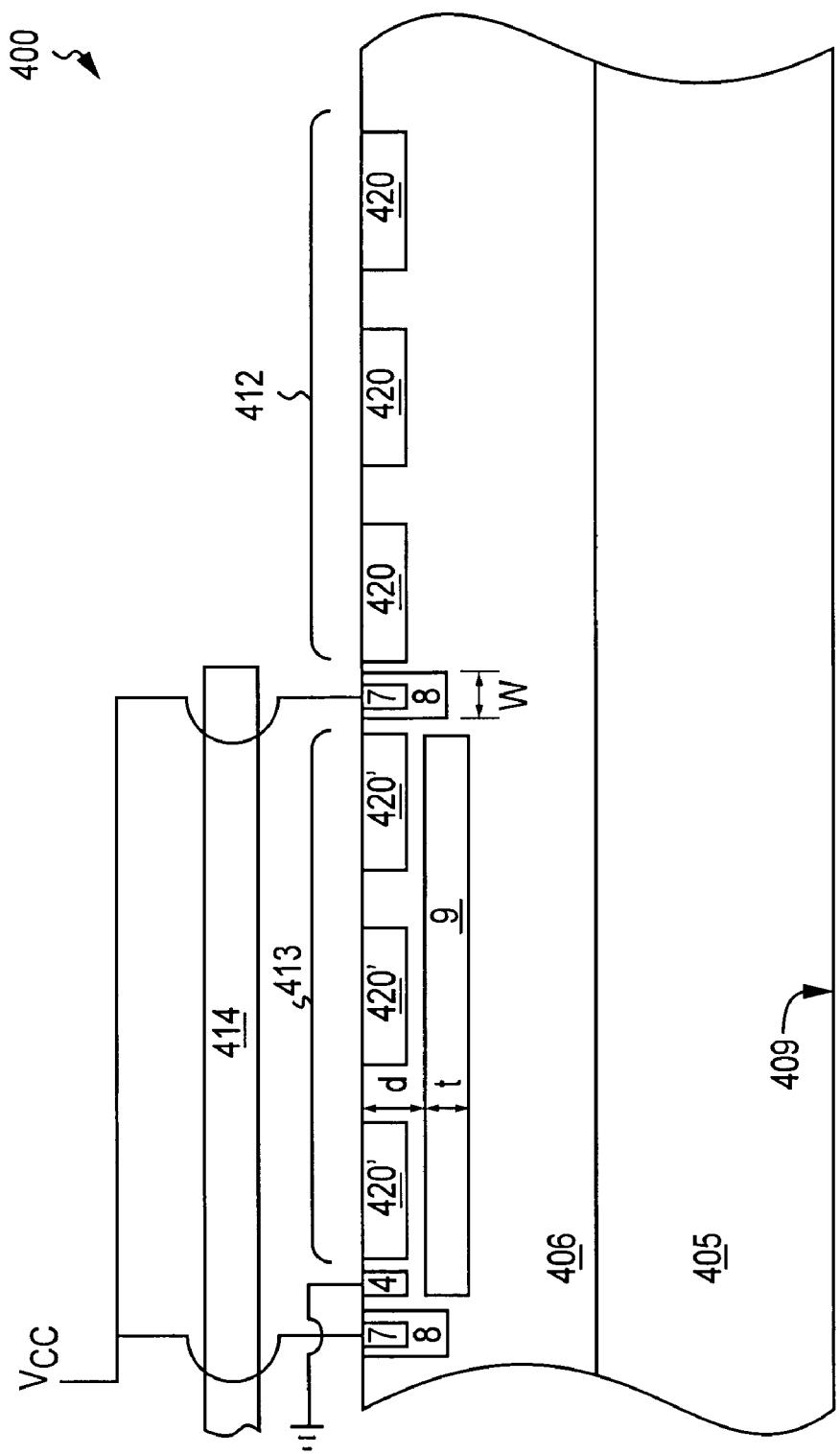
FIG. 5 is a cross-section of an embodiment of the image sensor of FIG. 4, taken across line Y-Y.

FIG. 5 is a cross-section of the array 411 taken across line Y-Y of FIG. 4. The figure depicts a portion of the dark correction region 413 and a portion of the active array region 412. Like dark correction region 13 (FIGS. 1 and 3), the illustrated dark correction region 413 includes dark correction pixel cells 420'. Incident light is prevented from reaching the photo-conversion devices of the pixel cells 420' in the dark correction region 413 by a shield 414 comprising, for example, a metal layer, a black color filter array, or any opaque material. While the dark correction region 413 is shown as having three dark correction pixels 420' and active array region 412 is shown as having three pixels 420, it should be noted that the illustration is a simplified cross-section and that the invention is not limited to having three pixels in each region. Both dark corrective region 413 and active array region 412 may have more or fewer pixels, as desired or suitable for the image sensor.

Protection against temporal noise caused by loose charge carriers described above is provided for the dark correction pixel cells 420' by forming a structure or structures to absorb the carriers generated by lateral diffusion caused by blooming in active array pixel cells 420 or near-infrared or infrared light reflected off the bottom 409 of the silicon substrate 405. In the embodiment depicted in FIG. 5, there are two sets of structures for absorbing carriers. A first n-type implant 9 is formed under the dark correction pixels 420' to provide an effective carrier absorbing region below the dark correction pixels 420'. The first n-type implant 9 will protect the dark correction pixels from being affected by the carriers that are generated by light that gets reflected off the silicon bottom 409 of the silicon substrate and by other sources. A second n-type implant 7 is formed on either side of (or around the perimeter of) the dark correction pixels 420'. An n-well 8 is also formed around the second n-type implant 7 so that the n-well 8 makes contact with the implant 7. This configuration provides a continuous n-type region surrounding the dark correction pixels 420' to provide an effective carrier absorbing region around the dark correction pixels 420'.

The second n-type implants 7 may be of higher doping concentration than the n-well 8 and the first n-type implant 9 and the n-well 8 may have higher doping concentration than the first n-type implant 9. The first n-type implant 9 provides low-energy storage for carriers that are generated in the epitaxial layer beneath the dark correction pixels 420'. Since the second n-type implants 7 and n-wells 8 have a higher doping concentration than the first n-type implant 9, the carriers will overflow from the first n-type implant 9 into the n-wells 8, and into the second n-type implants 7. From the second n-type implants 7, the carriers are drawn out through a power source $V_{cc}$ that is connected to the second n-type implant 7. The doping concentration of the first n-type implant 9 may be from about $1\times10^{15}$ atoms per cm$^3$ to about $1\times10^{17}$ atoms per cm$^3$. The doping concentration of the n-well 8 may be from about $1\times10^{16}$ atoms per cm$^3$ to about $1\times10^{17}$ atoms per cm$^3$. The doping concentration of the second n-type implant 7 may be from about $1\times10^{17}$ atoms per cm$^3$ to about $1\times10^{18}$ atoms per cm$^3$. The doping concentrations may be modified and optimized to any concentration suitable for the configuration of the pixel array.

In one exemplary embodiment, the first n-type implant 9 is formed to a depth d of from about 0.8 μm to about 1.2 μm, more preferably 1.0 μm, and has a thickness t of about 0.5 μm. The n-well 8 may have a width w of about 0.5 μm. However, the first n-type implant 9 may have any depth and the n-well 8 may have any width suitable for the configuration of the pixel array.

Figure 6:
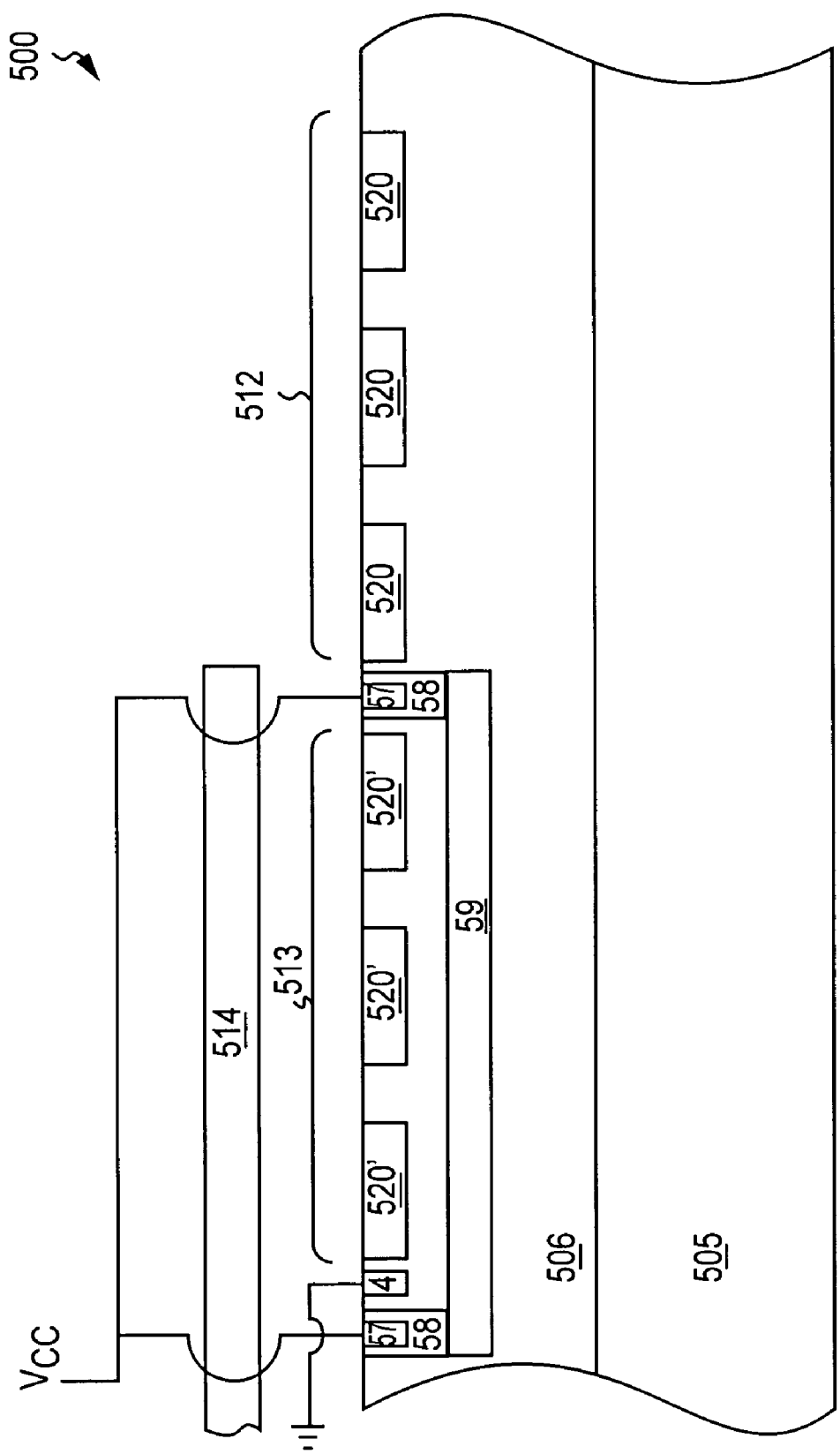
FIG. 6 is a cross-section of another embodiment of the image sensor of FIG. 4, taken across line Y-Y.

In another embodiment of the invention, a first n-type implant 59 is formed under the dark correction pixel cells 520' of image sensor 500, as shown in FIG. 6. As with FIG. 5, it should be noted that the embodiment illustrated in FIG. 6 is not limited having three pixels in each region. Both dark corrective region 513 and active array region 512 may have more or fewer pixels, as desired or suitable for the image sensor. The first n-type implant 59 is formed under the dark correction pixels 520'. A second n-type implant 57 is formed on either side of (or around the perimeter of) the dark correction pixels 520'. An n-well 58 is formed under the second n-type implant 57 so that it makes contact with the second n-type implant 57 as well as the first n-type implant 59. This provides a continuous n-type region surrounding the dark correction pixel cells 520'. The implants 57, 58, and 59 may be formed with a different doping concentrations as described above with respect to FIG. 6, such that the second n-type implants 57 and n-wells 58 have a higher doping concentration than the first n-type implant 59. Alternatively, they may be formed such that they have equal or lower doping concentrations. Because the implants 57, 58, and 59 are electrically connected, the carriers will flow from the first n-type implant 59 into the n-wells 58, and into the second n-type implants 57 and from the second n-type implants 57, since the carriers are drawn out through a power source $V_{cc}$ that is connected to the second n-type implant 57.

Figure 7:
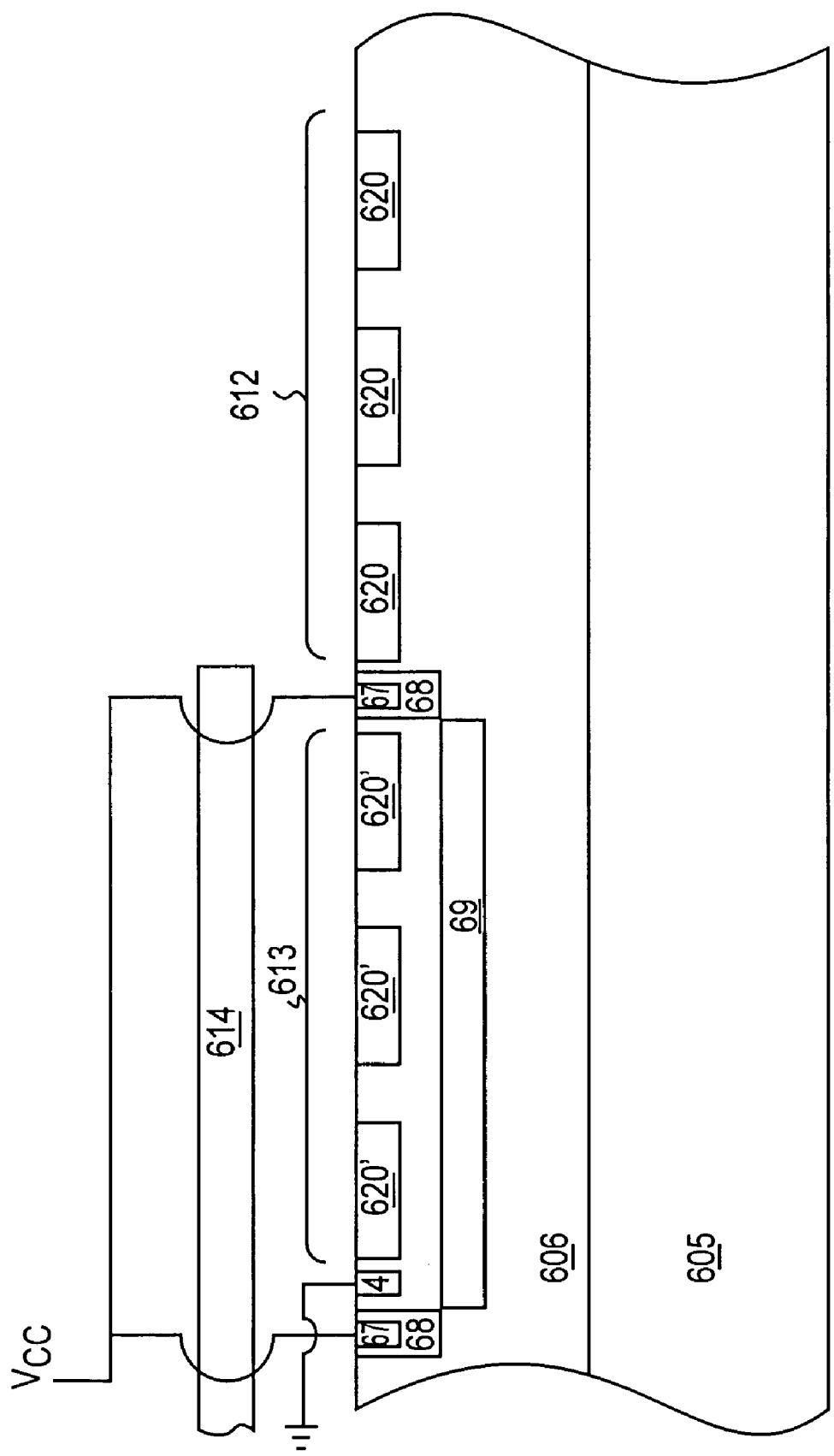
FIG. 7 is a cross-section of another embodiment of the image sensor of FIG. 4, taken across line Y-Y.
Figure 8:
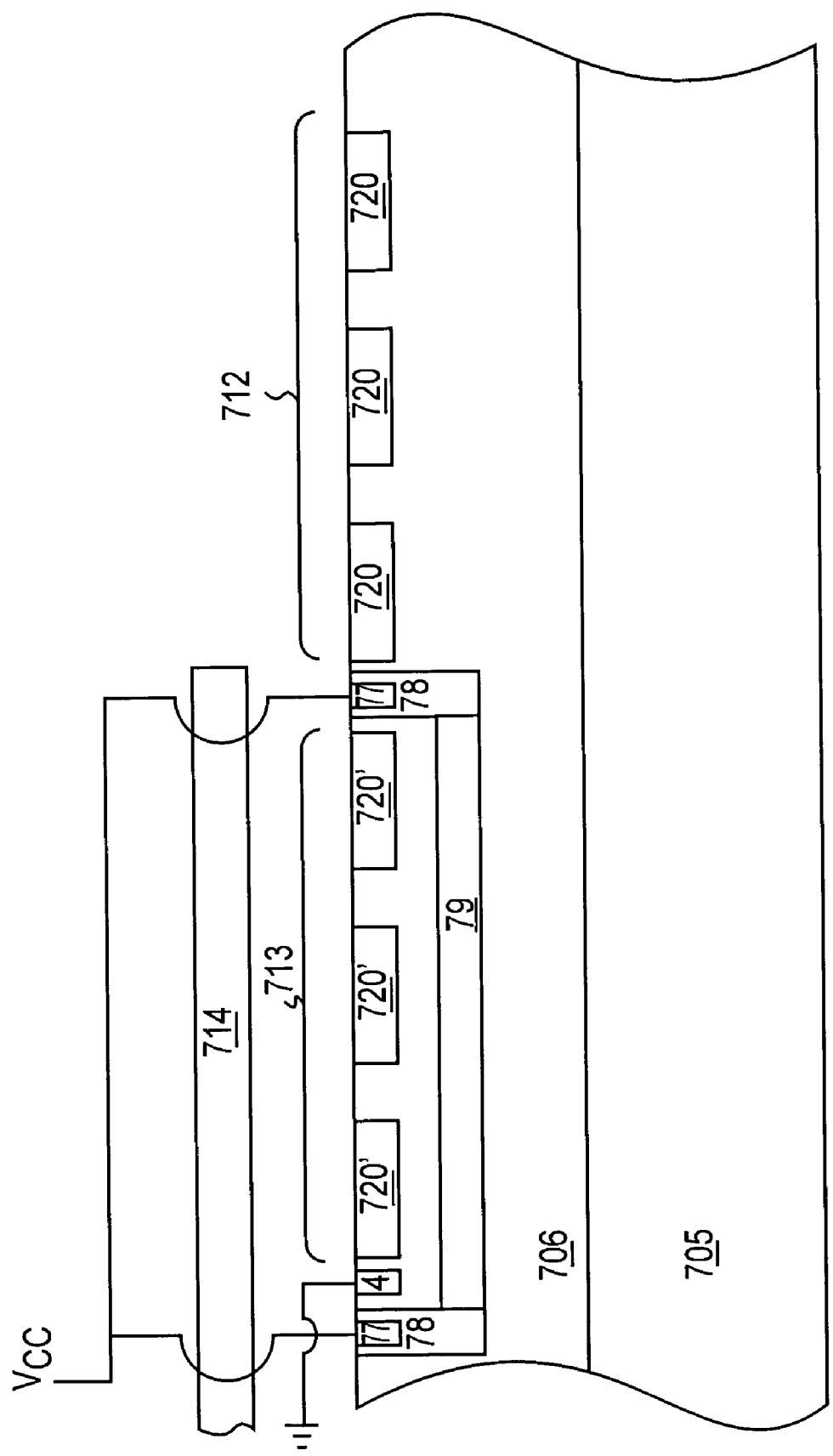
FIG. 8 is a cross-section of another embodiment of the image sensor of FIG. 4, taken across line Y-Y.
Figure 9:
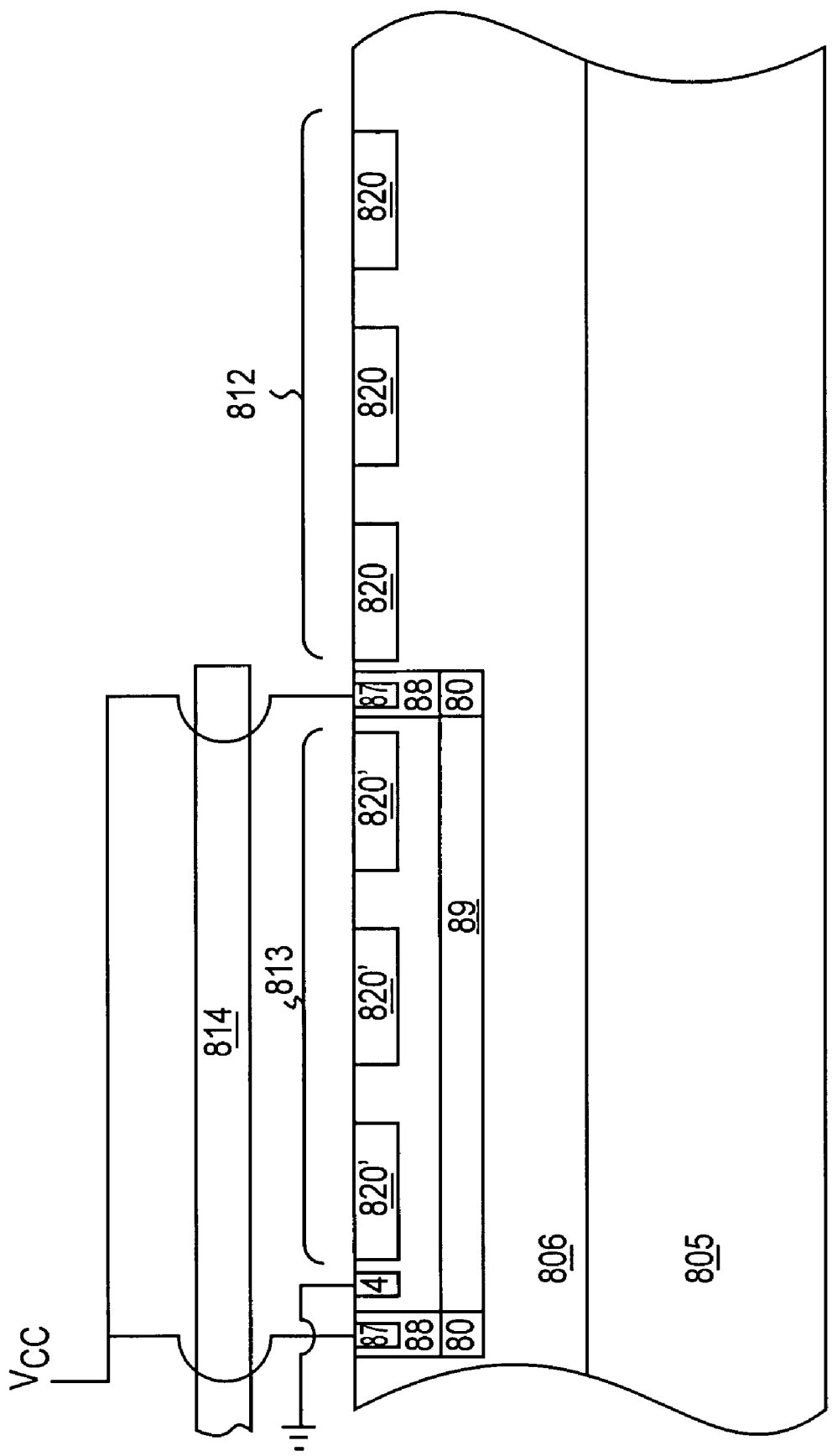
FIG. 9 is a cross-section of another embodiment of the image sensor of FIG. 4, taken across line Y-Y.

Other exemplary embodiments are illustrated in FIGS. 7-9. FIG. 7 illustrates an n-well region 68 being formed such that its bottom extends to the upper-most portion of a first n-type implant 69. Unlike the embodiment of FIG. 6, there is the n-well 68 does not have a surface that contacts a surface of the first n-type implant 69.

FIG. 8 illustrates an n-well region 78 being formed such that its bottom extends to the lower-most portion of a first n-type implant 79 and the lower portion of n-well region 78 is in contact with the outer edge of n-type implant 79. This forms a continuous n-type region around the dark correction pixel cells 720' with an n-well 78 that has a surface that contacts a surface of the first n-type implant 79.

FIG. 9 illustrates an n-well region 88 that intersects with a first n-type implant 89 in an intersecting n-type region 80. This forms a continuous n-type region around the side and below the dark correction pixel cells 820'. The doping concentration of intersecting n-type region 80 may be the sum of the doping concentrations of n-well region 88 and first n-type implant 89.

It is also possible to have spaced openings in the n-type region between the dark correction pixel cells and the bottom of the substrate. However, it should be noted that the dark correction pixel cells will be completely surrounded by a depletion region in spaces between n-type regions due to the power source $V_{cc}$ drawing carriers out through adjacent regions.

Because the dark correction pixels 420', 520', 620', 720', 820' of FIGS. 5-9, respectively, are completely surrounded by depletion regions and/or n-wells and n-type implant regions, they are isolated from any ground source since they are no longer in communication with the rest of the p-type substrate 405, 505, 605, 705, 805. Therefore, a p+ contact 4 is provided to connect the dark correction regions 413, 513, 613, 713, 813, to ground.

It should be noted that the configuration of the pixel cells 20, 20', 420, 420', 520, 520', 620, 620', 720, 720', 820, 820' is only exemplary and that various changes may be made as are known in the art and pixel cells of the image sensor may have other configurations. For example, although the invention is described in connection with four-transistor (4T) pixel cells 20, 20', the invention may also be incorporated into other pixel circuits having different numbers of transistors. Without being limiting, such a circuit may include five-transistor (5T) pixel cells, six-transistor (6T) pixel cells, and seven-transistor (7T) or more pixel cells. The 5T, 6T, and 7T pixel cells would differ from the 4T pixel cell by the addition of one, two, or three transistors, respectively, such as one or more of a shutter transistor, a conversion gain transistor, and an anti-blooming transistor. The circuit may also include three-transistor (3T) pixel cells.

Also, while the above embodiments are described in connection with p-n-p-type photodiodes as photosensors, the invention is not limited to these embodiments. The invention also has applicability to imagers employing other types of photo-conversion devices. In addition, while the above embodiments are described and illustrated has having p-type substrates and n-type implants, the invention is not limited to p-type substrates. The invention is applicable to n-type substrates having p-type implants as well.

Figure 10:
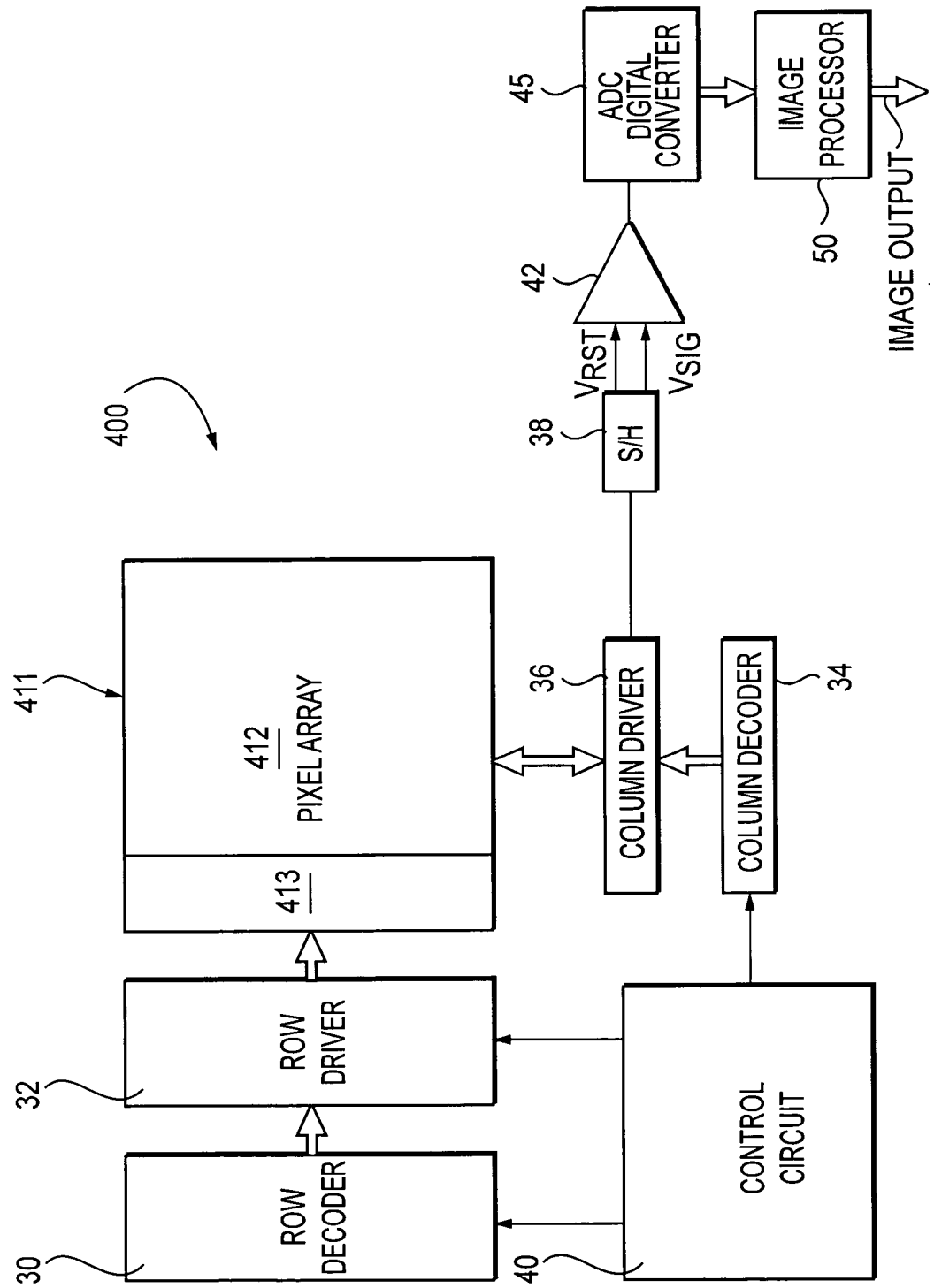
FIG. 10 is a block diagram of a processor system according to an exemplary embodiment of the invention.

FIG. 10 illustrates a block diagram for a CMOS imager 400. The imager 400 includes a pixel array 411, having an active array region 412 and dark correction region 413. The pixels of each row in array 411 are all turned on at the same time by a row select line and the pixels of each column are selectively output by a column select line. A plurality of row and column lines are provided for the entire array 411.

The row lines are selectively activated by the row driver 32 in response to row address decoder 30 and the column select lines are selectively activated by the column driver 36 in response to column address decoder 34. Thus, a row and column address is provided for each pixel. The CMOS imager 400 is operated by the control circuit 40, which controls address decoders 30, 34 for selecting the appropriate row and column lines for pixel readout, and row and column driver circuitry 32, 36, which apply driving voltage to the drive transistors of the selected row and column lines.

Each column contains sampling capacitors and switches in a sample and hold (S/H) circuit 38 associated with the column driver 36 reads a pixel reset signal $V_{rst}$ and a pixel image signal $V_{sig}$ for each selected pixel. A differential signal ($V_{rst}$–$V_{sig}$) is produced by differential amplifier 42 for each pixel. The signal is digitized by analog-to-digital converter 45 (ADC). The analog-to-digital converter 45 supplies the digitized pixel signals to an image processor 50, which forms a digital image output.

Figure 11:
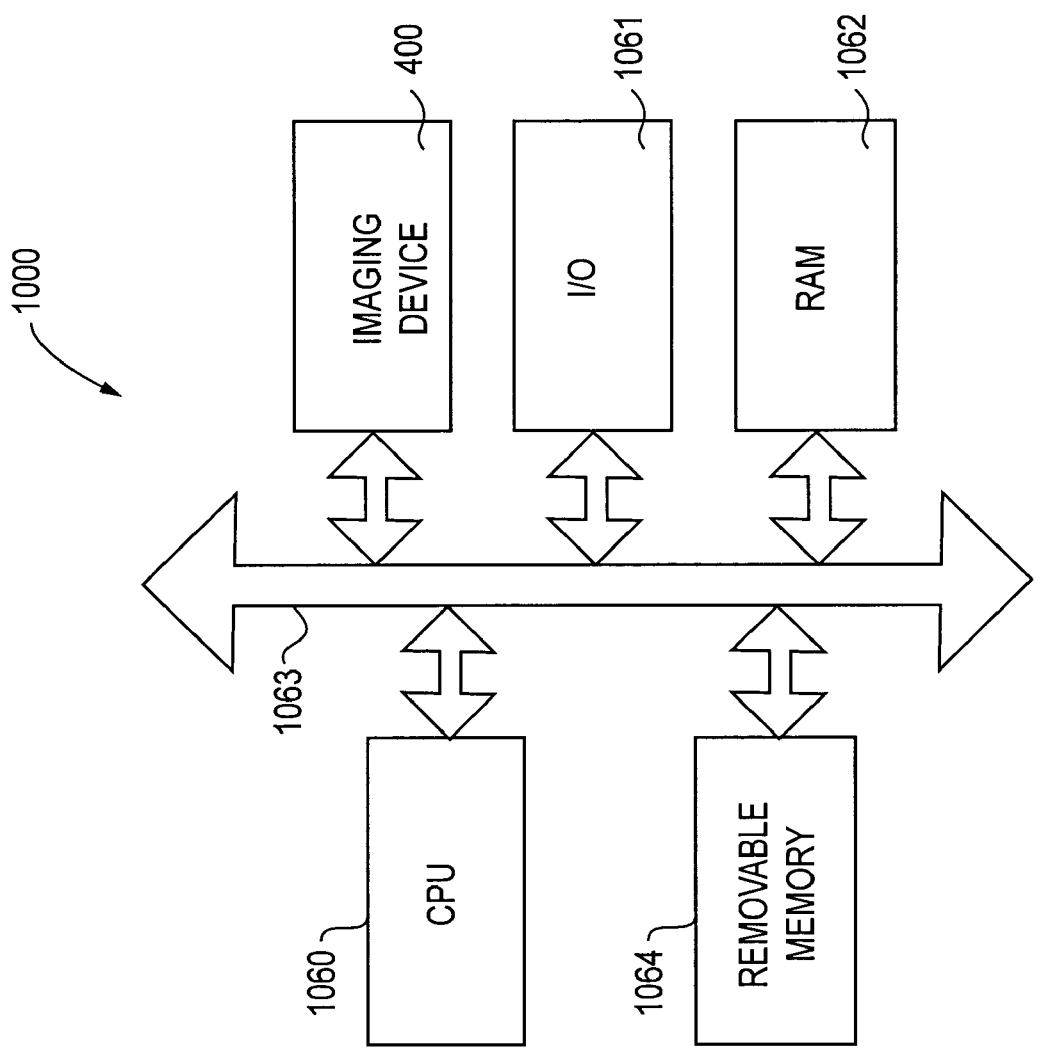
FIG. 11 is a processor-based system according to an exemplary embodiment of the invention.

FIG. 11 illustrates a processor-based system 1000 including an image sensor 400 of FIG. 4 having shielded dark correction pixel cells according to an embodiment of the invention. The processor-based system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other system employing an imager.

The processor-based system 1000, for example a camera system, generally comprises a central processing unit (CPU) 1060, such as a microprocessor, that communicates with an input/output (I/O) device 1061 over a bus 1063. Image sensor 400 also communicates with the CPU 1060 over bus 1063. The processor-based system 1000 also includes random access memory (RAM) 1062, and can include removable memory 1064, such as flash memory, which also communicate with CPU 1060 over the bus 1063. Image sensor 400 may be combined with a processor, such as a CPU, digital signal processor, or microprocessor, with or without memory storage on a single integrated circuit or on a different chip than the processor.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel array, comprising:
   a plurality of active array pixels on a substrate;
   a plurality of dark correction pixels on the substrate; and
   a barrier implant region separate from and adjacent to said plurality of dark correction pixels for absorbing carriers, said barrier implant region having a horizontal barrier implant region under said plurality of dark correction pixels and a vertical barrier implant region around the perimeter of said plurality of dark correction pixels, between said plurality of dark correction pixels and said plurality of active array pixels, said vertical barrier implant region being connected to a voltage source, wherein said horizontal and vertical barrier implant regions are formed such that a doping concentration of an area of the vertical barrier implant region that is proximal to the voltage source connection is higher than a doping concentration of areas on the horizontal and vertical barrier implant regions that are non-proximal to the voltage source connection.

2. The pixel array of claim 1, wherein said barrier implant region has an n-type conductivity.

3. The pixel array of claim 1, wherein said barrier implant region is located at least between said plurality of dark correction pixels and a bottom of said substrate.

4. The pixel array of claim 1, wherein said barrier implant region is located at least between said plurality of dark correction pixels and said plurality of active array pixels.

5. The pixel array of claim 1, further comprising a connection to a ground voltage between said plurality of dark correction pixels and said barrier implant region.

6. The pixel array of claim 4, wherein said barrier implant region is a continuous region surrounding said plurality of dark correction pixels.

7. The pixel array of claim 1, wherein said vertical barrier implant region is not connected to said horizontal barrier implant region.

8. The pixel array of claim 1, wherein said vertical barrier implant region has a higher doping concentration than said horizontal barrier implant region.

9. The pixel array of claim 8, wherein said vertical barrier implant region has a doping concentration in the range of about $1 \times 10^{17}$ atoms per cm$^3$ to about $1 \times 10^{18}$ atoms per cm$^3$ and said horizontal barrier implant region has a doping concentration in the range of about $1 \times 10^{15}$ atoms per cm$^3$ to about $1 \times 10^{17}$ atoms per cm$^3$.

10. The pixel array of claim 1, wherein said vertical barrier implant region has an implant region on its sides and bottom having a dopant concentration of about $1 \times 10^{16}$ atoms per cm$^3$ to about $1 \times 10^{17}$ atoms per cm$^3$.

11. The pixel array of claim 7, wherein said second region has spaced openings.

12. An image sensor, comprising:
   an active array region on a substrate for generating an image signal from incident light;
   a dark correction region on the substrate for generating a dark correction signal to correct dark currents and row-wise temporal noise;
   a perimeter isolation structure surrounding said dark correction region for absorbing carriers from lateral diffusion from said active array region, said perimeter isolation structure being connected to a voltage source;
   an underlying isolation structure between said dark correction region and a bottom of said substrate for absorbing carriers traveling through a lower part of said substrate,
   wherein a doping concentration of an area of the perimeter isolation structure that is proximal to the voltage source connection is higher than a doping concentration of areas on the underlying isolation structure and the perimeter isolation structure that are non-proximal to the voltage source connection.

13. The image sensor of claim 12, wherein said underlying isolation structure is a first n-type implant having a first doping concentration.

14. The image sensor of claim 13, wherein said perimeter isolation structure comprises a second n-implant region having a second doping concentration and an n-well region having a third doping concentration surrounding said second n-implant region on its sides and bottom.

15. The image sensor of claim 12, wherein said perimeter isolation structure is in contact with said underlying isolation structure.

16. The image sensor of claim 12, wherein said perimeter isolation structure is not in contact with said underlying isolation structure.

17. The image sensor of claim 14, wherein said first doping concentration is in the range of about $1 \times 10^{15}$ atoms per cm$^3$ to about $1 \times 10^{18}$ atoms per cm$^3$, said second doping concentration is in the range of about $1 \times 10^{17}$ atoms per cm$^3$ to about $1 \times 10^{18}$ atoms per cm$^3$, and said third doping concentration is in the range of about $1 \times 10^{16}$ atoms per cm$^3$ to about $1 \times 10^{17}$ atoms per cm$^3$.

18. The image sensor of claim 12, wherein said underlying isolation structure has a plurality of spaced openings.

19. An image processor system comprising:
a processor;
an image sensor comprising:
an active array of pixel cells on a substrate;
a dark correction region on said substrate; and
a barrier implant region separate from and adjacent to said plurality of dark correction region for absorbing carriers, said barrier implant region having a horizontal barrier implant region under said dark correction region and a vertical barrier implant region around the perimeter of said dark correction region, between said dark correction region and said active array of pixel cells, said vertical barrier implant region being connected to a voltage source, wherein said horizontal and vertical barrier implant regions are formed such that a doping concentration of an area of the vertical barrier implant region that is proximal to the voltage source connection is higher than a doping concentration of areas on the horizontal and vertical barrier implant regions that are non-proximal to the voltage source connection.

20. The image processor system of claim 19, wherein said barrier implant region has an n-type conductivity.

21. The image processor system of claim 19, wherein said barrier implant region has a discontinuous doping concentration and comprises at least one first section having a first doping concentration and a second section having a second doping concentration.

22. The image processor of claim 21, wherein said first doping concentration is higher than said second doping concentration.

23. The image processor of claim 19, wherein said barrier implant region has at least one opening.

24. A method of forming a pixel array, the method comprising the acts of:
providing a substrate;
forming an active array of pixels;
forming a plurality of dark correction pixels on at least one side of said active array of pixels;
forming a horizontal doping barrier implant in said substrate under said plurality of dark correction pixels;
forming vertical doping barrier implants in said substrate around the perimeter of said plurality of dark correction pixels, between said plurality of dark correction pixels and said active array of pixels; and
forming connections coupling a voltage source to said vertical barrier implants,
wherein said horizontal and vertical doping barriers are formed such that a doping concentration of an area of the vertical doping barrier that is proximal to the voltage source connections is higher than a doping concentration of areas on the horizontal and vertical doping barriers that are non-proximal to the voltage source connections.

25. The method of claim 24, further comprising the act of forming wells having a first conductivity around and in contact with the sides and bottoms of said vertical doping barrier implants.

26. The method of claim 25, wherein said steps of forming a horizontal doping barrier implant and forming said wells includes forming said horizontal doping barrier implant and said wells to be in contact with each other.

27. The method of claim 25, wherein said steps of forming a horizontal doping barrier implant and forming said wells includes forming said horizontal doping barrier implant such that they are not in contact with said wells.

28. The method of claim 24, wherein said steps of forming a horizontal doping barrier implant and forming said wells includes forming said horizontal doping barrier implant and said wells such that they are not in contact with each other.

29. The method of claim 25, wherein said first conductivity is an n-type conductivity.

30. The method of claim 25, wherein said first conductivity is a p-type conductivity.

31. A pixel array comprising:
a plurality of active array pixels on a substrate;
a plurality of dark correction pixels on the substrate;
a bottom barrier region in said substrate under said plurality of dark correction pixels for absorbing carriers; and
a surrounding barrier region in said substrate surrounding said plurality of dark correction pixels for absorbing carriers, said surrounding barrier region being connected to a voltage source,
wherein a doping concentration of an area of the surrounding barrier region that is proximal to the voltage source connection is higher than a doping concentration of areas on the bottom barrier region and the surrounding barrier region that are non-proximal to the voltage source connection.

32. The pixel array of claim 31, wherein said bottom barrier region is not connected to said surrounding barrier region.

33. The pixel array of claim 31, wherein said bottom barrier region is connected to said surrounding barrier region.

34. The pixel array of claim 31, wherein said bottom barrier region has a plurality of spaced openings.

35. The pixel array of claim 31, wherein said surrounding barrier region has a first region having a first doping concentration and a second region surrounding said first region on its sides and bottom having a second doping concentration.

36. The pixel array of claim 32, wherein said first doping concentration is greater than said second doping concentration.

* * * * *